United States Patent [19]

Sheppard

[11] 4,389,705
[45] Jun. 21, 1983

[54] SEMICONDUCTOR MEMORY CIRCUIT WITH DEPLETION DATA TRANSFER TRANSISTOR

[75] Inventor: Douglas P. Sheppard, Grapevine, Tex.

[73] Assignee: Mostek Corporation, Carrollton, Tex.

[21] Appl. No.: 294,842

[22] Filed: Aug. 21, 1981

[51] Int. Cl.³ .................. G11C 17/00; G11C 7/00
[52] U.S. Cl. ................................. 365/104; 365/203
[58] Field of Search ............... 365/104, 203, 184, 185

[56] References Cited

U.S. PATENT DOCUMENTS

| 3,728,696 | 4/1973 | Polkinghorn | 365/203 |
| 3,848,236 | 11/1974 | Troutman | 365/203 |

FOREIGN PATENT DOCUMENTS

| 53-91560 | 8/1978 | Japan | 365/104 |
| 649035 | 2/1979 | U.S.S.R. | 365/184 |

*Primary Examiner*—Stuart N. Hecker

[57] ABSTRACT

A read only memory (ROM) circuit (10) includes a memory storage transistor (16) which is fabricated to have one of a plurality of threshold voltages corresponding to predetermined data states. The source and drain terminals of the memory transistor (16) are connected between a column node (18) and a bit line (20). A lightly depleted data transfer transistor (30) is connected between the bit line (20) and a data line (14). The column node (18), bit line (20) and data line (14) are precharged. A memory address is decoded to drive a selected word line (12) and a selected column decode line (32) to a high voltage state. A transistor (34) discharges the column node (18). Depending upon the state of the memory storage transistor (16) the bit line (20) is discharged or maintained precharged. The state of bit line (20) is transmitted through the data transfer transistor (30) to the data line (14). The data transfer transistor (30) can be fabricated as a relatively small device due to the large turn on voltage applied thereto because the transistor (30) is a depletion device. The smaller size of a plurality of the transistors (30) results in a substantial saving in space and reduces capacitive loading on the data line (14) thereby speeding up the discharge rate of the data line (14).

4 Claims, 1 Drawing Figure

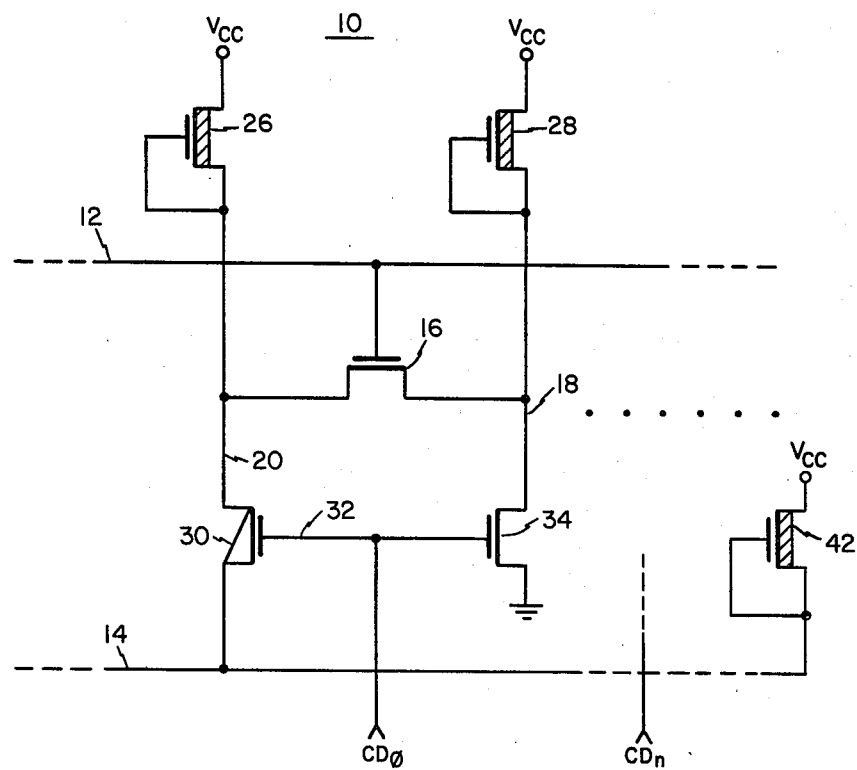

SEMICONDUCTOR MEMORY CIRCUIT WITH DEPLETION DATA TRANSFER TRANSISTOR

TECHNICAL FIELD

The present invention pertains to semiconductor memories and in particular to the data transfer (column) circuitry connecting a memory cells to an input/output line.

BACKGROUND ART

In semiconductor memory circuits a memory cell, when accessed, drives a column line, which may also be termed a bit line, to a high or low state as a function of the data stored in the memory cell. It has been the typical practice to transmit the data state on the bit line through an enhancement type transistor to an input/output line. As integrated circuits have been developed to utilize relatively low (5.0 volt) supply voltages the amplitude of driving voltages for transistors has become critical. With reduced fabrication geometries and lower voltages it has become increasingly difficult to detect the small data signals produced by memory cells. To transfer a data state from a bit line to an I/O line there must be a minimum of resistance through the data transfer transistor which is also referred to as a column select transistor. It is well known that the conductivity of an FET transistor is proportional to its size and to the applied gate-to-source voltage. As available voltages have become less there has been a proportionate need to increase the size of the data transfer transistor. But since there is one data transfer transistor for each one or group of memory cells the resulting increase in size can be significant for the overall circuit.

In view of the above problems regarding driving voltage and size for data transfer transistors there exists a need for a memory cell circuit in which there is a substantially greater drive voltage applied to the data transfer transistors such that the transistor can be fabricated to have a lesser size.

SUMMARY OF THE INVENTION

A selected embodiment of the present invention comprises a semiconductor memory circuit. The memory circuit includes a word line which is connected to receive a first address signal, a column decode line connected to receive a second address signal and a bit line. A memory cell is provided for storing a data state with the memory cell connected to be accessed by said first address signal received through said word line. When the memory cell is selected it drives the bit line to a voltage state which corresponds to the data state stored in the memory cell. The memory circuit further includes a depletion data transfer transistor having the gate terminal thereof connected to the column decode line and the drain and force terminals thereof connected between the bit line and the data line are selectively connecting the bit line and the data line in response to said second address signal received through said column decode line. The depletion data transfer transistor receives a greater gate-to-source drive signal as compared to conventional enhancement data transfer transistors thus permitting the depletion data transfer transistor to be fabricated as a smaller device for providing the necessary conductivity between the bit line and the data line.

BRIEF DESCRIPTION OF THE DRAWINGS

For a more complete understanding of the present invention and the advantages thereof, reference is now made to the following description taken in conjunction with the accompanying Drawing in which the FIGURE is a schematic illustration of a ROM circuit in accordance with the present invention.

DETAILED DESCRIPTION

Referring now to the FIGURE a ROM circuit 10 is representative of one of a plurality of memory cell circuits which are included in a full memory array. The circuit 10 includes a word line 12 and a data line 14. These lines extend to other similar ROM circuits in the memory array. The word line 12 is driven from a low to a high state in response to a memory address signal applied to select the circuit 10.

The word line 12 is connected to the gate terminal of a memory storage transistor 16 which has the drain and source terminals thereof connected between a column node 18 and a bit line 20.

A depletion transistor 26 has the drain terminal thereof connected to a power supply source $V_{cc}$ and has the gate and source terminals thereof connected to bit line 20. A depletion transistor 28 has the drain terminal thereof connected to $V_{cc}$ and the gate and source terminals thereof connected to column node 18. In a preferred embodiment $V_{cc}$ is +5.0 volts.

A lightly depleted data transfer transistor 30 has the gate terminal thereof connected to a column decode line 32 and has the source and drain terminals thereof connected between bit line 20 and data line 14. Column decode line 32 receives a decoded address signal $CD_\phi$.

An enhancement transistor 34 has the gate terminal thereof connected to column decode line 32, the drain terminal thereof connected to column node 18 and the source terminal thereof grounded.

Line 32 serves to receive a column decode ($CD_\phi$) signal which is generated as a function of the address applied to the memory circuit which includes ROM circuit 10. There are a plurality of such lines as 32 corresponding to lines $CD_\phi$ through $CD_n$.

A depletion pull up transistor 42 has the drain terminal thereof connected to $V_{cc}$ and the gate and source terminals thereof connected to data line 14. Typically only one pull up transistor, such as 42, is provided for the entire data line 14.

In a representative embodiment of the present invention the depletion data transfer transistor 30 has a threshold voltage of approximately −2.0 volts, the enhancement transistor 34 has the threshold voltage of approximately 0.5 volts in which the supply voltage $V_{cc}$ is 5.0 volts.

In a typical ROM application the transistor 16 is fabricated to have either a very low threshold voltage such that it can be easily turned on or is fabricated to have an extremely high threshold voltage wherein the transistor 16 cannot be turned on by the word line signal supplied to it.

Operation of the circuit 10 of the present invention is now described in reference to the FIGURE. In the first step of operation of the circuit 10 the bit line 20, column node 18 and data line 14 are precharged to a high voltage state respectively through transistors 26, 28 and 42. The address provided to the memory array is decoded and a word line signal is applied to word line 12 to drive the line from a low to a high voltage state. For selection of circuit 10 the address is further decoded to produce a column decode signal CDø which drives the column decode line 32 from a low to a high voltage state.

When the CDø signal is in a low voltage state transistor 34 will be turned off to permit the column node 18 to be pulled to approximately $V_{cc}$ through transistor 28. The low state on line 32 serves to pinch off the transistor 30 since its source is at approximately five volts and the gate is at approximately zero volts. As noted above a typical threshold voltage for transistor 30 is $-2.0$ volts. Thus, in the nonselected condition the circuit 10 has the column node 18, bit line 20 and the data line 14 precharged to a high state but with the transistors 16, 30 and 34 turned off.

When a memory address is decoded to select memory circuit 10 the word line 12 will receive a word line signal which drives the line 12 to a high state. Likewise the memory address will be decoded to drive the column decode line 32 to a high voltage state. When line 32 goes high transistor 34 is turned on thereby pulling column node 18 to a low voltage state. Driving line 32 high also turns on transistor 30 which connects line 20 to line 14. The next step in the memory cycle is dependent upon the threshold voltage which was fabricated into the transistor 16. If a high threshold voltage was fabricated for transistor 16 it will not be turned on and the bit line 20 together with the data line 14 will be maintained at a high voltage state.

But if the transistor 16 was fabricated with a low threshold voltage the voltage difference between the gate and source terminals of transistor 16 will cause it to be turned on which will in turn cause the bit line 20 to be discharged through transistor 16, column node 18 and transistor 34 to ground. As the voltage at bit line 20 falls the gate-to-source voltage of transistor 30 will become more positive thereby turning on transistor 30 harder which further discharges the data line 14. The turn on voltage of an FET is the gate-to-source voltage minus the threshold voltage. For an example, the threshold voltage of depletion transistor 30 can be $-2.0$ volts and a corresponding enhancement transistor can have a threshold voltage of $+0.5$ volts. If the bit line 20 is driven to 2.0 volts and line 32 is driven to 5.0 volts, the resulting gate-to-source voltage of transistor 30 is 3.0 volts. Thus, the turn on voltage for a depletion transistor 30 is $3.0-(-2.0)=5.0$ volts but for an enhancement transistor 30 the turn on voltage would be $3.0-0.5=2.5$ volts. Assuming all other transistor parameters remain the same the depletion transistor 30 has twice the turn on voltage of a corresponding enhancement transistor. As a result the depletion transistor 30 can be fabricated to have one-half the width of an enhancement transistor in this application.

Since there are a substantial number of the transistors 30 in a large memory array it can be seen that there is a corresponding significant savings in the area required on the substrate for the entire memory circuit.

A significant advantage of the present invention is the reduction of the capacitive load due to the smaller size transistors 30 on the data line 14. In a large memory array there are a substantial number, for example, 128, of the transistors 30 connected to the data line 14. This reduction in capacitive load decreases the discharge time of line 14 thereby increasing the speed of the memory.

In circuit 10 there are pull up transistors 26, 28 and 42 for precharging the respective bit line 20, column node 18 and data line 14. It is understood that other techniques such as clock precharging can likewise be used to precharge these lines and node.

N-channel transistors are utilized in the embodiment illustrated in the FIGURE, however, it is recognized that a similar circuit can be fabricated using P-channel transistors.

Although one embodiment of the invention has been illustrated in the accompanying Drawings and described in the foregoing Detailed Description, it will be understood that the invention is not limited to the embodiment disclosed, but is capable of numerous rearrangements, modifications and substitutions without departing from the scope of the invention.

I claim:

1. A semiconductor memory circuit, comprising:
   a word line connected to receive a first address signal;
   a column decode line connected to receive a second address signal;
   a bit line;
   a memory cell for storing a data state, said memory cell connected to be accessed by said first address signal received through said word line for driving said bit line to a voltage state corresponding to the data state stored in said memory cell; and
   a depletion data transfer transistor having the gate terminal thereof connected to said column decode line and the drain and source terminals thereof connected between said bit line and said data line for selectively connecting said bit line and said data line in response to said second address signal received through said column decode line.

2. The semiconductor memory circuit recited in claim 1 wherein said memory cell comprises a read only memory (ROM) circuit having a memory transistor fabricated to have one of a plurality of threshold voltages, said memory transistor having the gate terminal thereof connected to said word line and the drain and source terminals thereof connected between said bit line and the drain terminal of a column select transistor having the gate terminal thereof connected to said column decode line and the source terminal thereof connected to a common node.

3. The semiconductor memory circuit recited in claim 1 including means for precharging said bit line and said data line.

4. A semiconductor memory circuit, comprising:
   a memory transistor fabricated to have one of a plurality of predetermined voltage thresholds corresponding to respective data states, the source and drain terminals of said memory transistor connected between a bit line and a first node;
   a word line connected to the gate terminal of said memory transistor, said word line for receiving a first address signal which has a first state when said word line is selected;
   a data line;
   means for precharging said bit line, said first node and said data line to said first state;
   a column decode line for receiving a second address signal which has a first state when said column line is selected;
   a depletion transistor having the gate terminal thereof connected to said column decode line and the drain and source terminals thereof connected between said bit line and said data line wherein said depletion transistor is rendered conductive when said second address signal is in said first state; and an enhancement transistor having the gate terminal thereof connected to said column decode line and the source and drain terminals thereof connected between a common node at a second state and said first node wherein said enhancement transistor is rendered conductive when said second address signal is in said first state thereby pulling said first node to said second state.

* * * * *